United States Patent
Waight

[19]

[11] Patent Number: 6,057,876
[45] Date of Patent: May 2, 2000

[54] DUAL CONVERSION SETTOP TERMINAL INCLUDING A SYSTEM FOR AVOIDING OSCILLATOR DIFFERENCE BEATS

[75] Inventor: Matthew Waight, Pipersville, Pa.

[73] Assignee: General Instrument Corporation, Hatboro, Pa.

[21] Appl. No.: 08/768,637

[22] Filed: Dec. 18, 1996

[51] Int. Cl.[7] .............................. H04N 7/10; H04N 5/44; H04H 1/02; H04H 7/00

[52] U.S. Cl. .............................. 348/11; 348/11; 348/10; 348/725; 348/726; 455/6.2; 455/6.3; 455/315; 455/197.1

[58] Field of Search ................................... 348/6, 10, 11, 348/607, 725, 726; 455/6.2, 6.3, 260, 314, 315, 317, 302, 197.1, 209

[56] References Cited

U.S. PATENT DOCUMENTS

| | | | |
|---|---|---|---|
| 3,639,840 | 2/1972 | Shekel et al. ............................ | 325/308 |
| 4,195,203 | 3/1980 | Sakai et al. ............................ | 179/1 GD |
| 4,225,974 | 9/1980 | Miyamoto ............................ | 455/315 |
| 4,395,777 | 7/1983 | Oki et al. ............................ | 455/314 |
| 4,425,579 | 1/1984 | Merrell ............................ | 348/11 |
| 4,520,507 | 5/1985 | Moon ............................ | 348/11 |
| 4,972,431 | 11/1990 | Keegan ............................ | 375/1 |
| 5,222,106 | 6/1993 | Satoh et al. ............................ | 455/209 |
| 5,361,407 | 11/1994 | Sawada et al. ............................ | 455/209 |
| 5,388,125 | 2/1995 | Toda et al. ............................ | 455/260 |
| 5,423,076 | 6/1995 | Westergren et al. ............................ | 455/260 |
| 5,640,697 | 6/1997 | Orndorff ............................ | 455/317 |
| 5,752,174 | 5/1998 | Matai et al. ............................ | 455/302 |
| 5,812,928 | 9/1998 | Watson, Jr. et al. ............................ | 348/11 |

Primary Examiner—John K. Peng
Assistant Examiner—Paulos M. Natnael
Attorney, Agent, or Firm—Volpe and Koenig, P.C.

[57] ABSTRACT

An improved multiple conversion CATV settop terminal eliminates the adverse effects of oscillator difference beats by selectively controlling local oscillators and the use of a wideband bandpass filter. The wideband bandpass filter is coupled between the output of an up converter mixer and the input of a down converter mixer. Each mixer receives a second input from its corresponding local oscillator. A system microprocessor is programmed to control each local oscillator such that the oscillator difference beat frequencies are translated out of a following IF filter passband. Once translated, the oscillator difference beat frequencies no longer present a source of distortion to the received information signal.

8 Claims, 2 Drawing Sheets

DUAL CONVERSION SETTOP TERMINAL INCLUDING A SYSTEM FOR AVOIDING OSCILLATOR DIFFERENCE BEATS

BACKGROUND OF THE INVENTION

1. Field of the Invention

This invention generally relates to cable television (CATV) communication systems. More particularly, the invention relates to a dual conversion CATV terminal which selectively relocates the high intermediate frequency (HI-IF), or selects a specific HI-IF frequency depending on the CATV frequency plan and the desired channel.

2. Description of Related Art

Most current CATV settop terminals use dual or multiple conversion tuners in order to achieve distortion performance and channel flatness of an acceptable quality. Single conversion tuners, widely used in most television receivers, fail to achieve optimum performance with a full spectrum of channels as is typically provided from a CATV network operator. Since single conversion tuners must operate with very large signal level differences between channels, adjacent channels are left empty and the total number of broadcast channels is relatively low when compared to a CATV system.

The basic structure of a typical dual conversion tuner includes a 47 to 860 MHz bandwidth input coupled to a heterodyne mixer or modulator which upconverts the desired input channel to a higher frequency. By using a HI-IF filter, image rejection, channel flatness, and channel loading to the second mixer is improved. This upconverted output is filtered by the HI-IF filter and sent to a second mixer which downconverts the signal to the desired output intermediate frequency (IF), which is typically between 41 and 47 MHz for a 6 MHz wide U.S. National Television System Committee (NTSC) or quadrature amplitude modulated (QAM) channel. The lower IF permits the use of economical surface acoustic wave (SAW) filters. Each mixer requires an oscillator which generates a specific frequency for the desired heterodyne output. However, the oscillator and mixer generate harmonics of the fundamental oscillator frequency which may mix with harmonics of the other oscillator within any active component, such as a mixer, oscillator, or an amplifier. When these harmonics mix together at the correct frequency, a particular "Oscillator Difference Beat" will fall within the output IF band interfering with the signal.

The creation of beats is dependent solely upon the difference between the two local oscillators and their harmonics and is independent of the input RF signal. Accordingly, since the first local oscillator varies in frequency when tuning to a specific channel, the situation is dynamic. As cable television systems increase their transmission bandwidth to frequencies of 750 MHz or higher, the potential for oscillator difference beats also increases. The use of integrated circuits and smaller tuner chassis makes the oscillator difference beats more difficult to prevent using traditional methods.

There have been attempts to minimize the adverse effects of oscillator difference beats. One of the most widely used methods is to mechanically shield the upconverter section from the downconverter section. Typically, a single or double-walled metal partition divides the printed circuit boards of each section. Covers are also used to enclose the chassis sections. A capacitive feed-through terminal is sometimes used to improve isolation between the two sections. However, mechanical isolation requires a minimum metal thickness of the chassis and compressional forces between the chassis and covers to adequately isolate the sections from each other. This frustrates attempts to reduce the size of tuner modules while directly adding to the cost.

A second approach is to select a HI-IF frequency which minimizes the number and/or severity of oscillator difference beats which fall within the IF band for a particular cable system or channel frequency plan standard. However, this requires knowledge of a particular channel map for a given cable system or channel standard. This solution is impractical in view of three widely used U.S. CATV systems which use different frequency plans. As described in the EIA-542 standard, there are standard (STD), incrementally related carriers (IRC), and harmonically related carriers (HRC). Additionally, many European systems do not use a standard channel map.

Accordingly, there exists a need for an inexpensive method to reduce oscillator difference beats in dual conversion CATV settop terminals regardless of the frequency plan used by the cable operator.

SUMMARY OF THE INVENTION

The present invention comprises a dual conversion CATV settop terminal which eliminates the adverse effects of oscillator difference beats by utilizing two selectively controllable local oscillators and a wider than normal HI-IF bandpass filter. The bandpass filter is coupled between the output of an upconverter mixer and the input of a downconverter mixer. Each mixer receives a second input from its corresponding local oscillator. A microprocessor is programmed to selectively control the local oscillator frequencies when tuning to a desired channel such that a specific oscillator difference beat is translated out of the IF bandwidth. Once the oscillator difference beat is translated from the IF bandwidth, the beat is filtered and will no longer present a source of interference to the signal.

Accordingly, it is an object of the present invention to provide a settop terminal which eliminates the adverse effects of oscillator difference beats.

Other objects and advantages will become apparent to those skilled in the art after reading the detailed description of the preferred embodiment.

DESCRIPTION OF THE PREFERRED EMBODIMENTS

Figure 1:
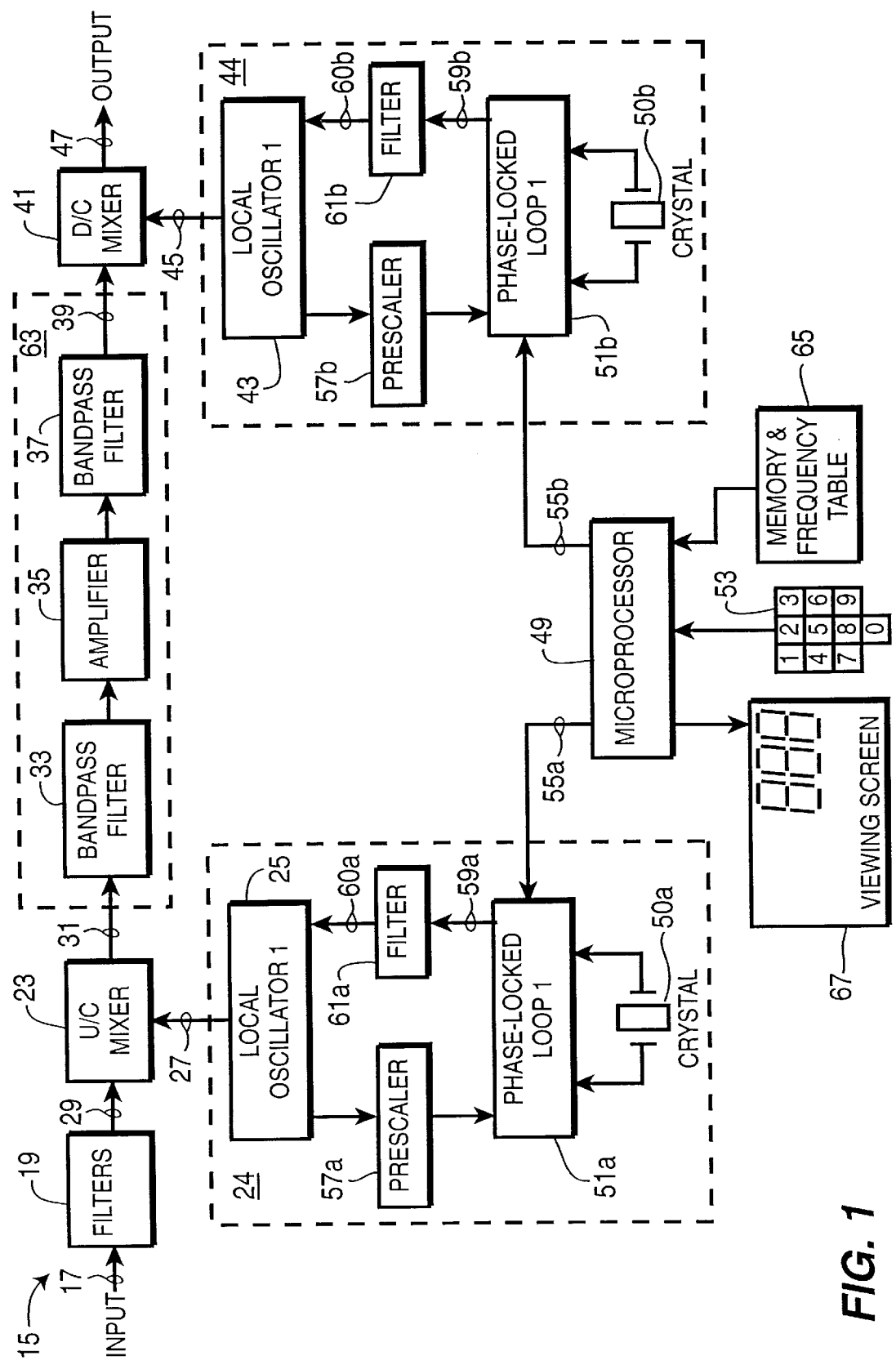
FIG. 1 is a block diagram of the preferred embodiment of the settop terminal present invention.

The preferred embodiment will be described with reference to the drawing figures where like numerals represent like elements throughout.

FIG. 1 is a block diagram of the dual conversion settop terminal of the present invention which includes a system 15 for avoiding oscillator difference beats. The system 15 is responsive to the selection of a particular channel by a consumer for viewing and/or listening. Each channel may represent modulated analog or digital signals or modulated digital data. When a consumer selects a particular channel, the entire frequency bandwidth 17 capable of being tuned to is modulated with a first local oscillator (LO1) 25 output 27 to drive an upconversion mixer 23 and translate the desired channel to a high intermediate frequency 31 (HI-IF). The HI-IF 31 is higher than the highest expected frequency in the input tuning bandwidth 17 thereby allowing only one occurrence of each input frequency at the HI-IF section 63. In the preferred system, the input filter 19 passes the band of input frequencies from 47 to 860 MHz while rejecting all lower or higher frequency signals. The entire selected band of frequencies is gain-controlled to minimize distortion by an automatic gain control (AGC) signal (not shown).

The input frequencies are translated to a new band starting at a low frequency of LO1 minus the highest input band frequency 17 and ending at a high frequency of LO1 25 minus the lowest input band frequency 17. The LO1 25 frequency 27 is selected to translate the desired input channel to correspond to the passband of bandpass filter 33. The passband of the filter should generally be three times the bandwidth of the channel being selected. With typical channel bandwidths of 6 to 8 MHz, the filter bandwidth would be approximately 20–30 MHz wide. The signal which comprises the desired signal and adjacent channels is amplified by a HI-IF amplifier 35 to maintain the noise figure of the system 15 by overcoming the losses in the upconversion mixer 23 and first HI-IF filter 33. The signal is then filtered with a second HI-IF bandpass filter 37 with the output signal 39 coupled to the downconversion mixer 41. A second local oscillator (LO2) 43 is coupled to the downconversion mixer 45. The difference between the HI-IF signal and the LO2 43 frequency 45 is the desired channel 47 in the IF band 47. The sum of the HI-IF signal and the LO2 43 frequency 45 also exists but is not used in this application. The desired channel along with some of the undesired adjacent channels is output 47 from the downconversion mixer 41 to subsequent IF processing.

The HI-IF section 63 occupies the region between 1078 and 1094 MHz, with the desired channel signal typically occupying the band from 1083 to 1089 MHz for NTSC signals. The upconverter stage 24 and downconverter stage 44 require adjustable oscillators LO1 25 and LO2 43 to avoid oscillator difference beats as will be explained in detail hereinafter.

The adjustable LO stages 24, 44 each include a local oscillator, LO1 25 and LO2 43, a prescaler 57a, 57b, a filter 61a, 61b, and a phase-locked loop system 51a, 51b. The LO stages 24, 44 are controlled by a digital microprocessor 49.

Local oscillators LO1 25 and LO2 43 are controlled by the microprocessor 49 and the phase-locked loops 51a, 51b. When a channel is selected by a consumer, the selection is made via an IR transmitter or a touchpad 53. The selection is converted by the microprocessor 49 into a divider number to divide the pre-scaler 57a, 57b local oscillator 25, 43 frequency 27, 45 in preparation for comparison to a reference frequency. A phase detector compares the divided local oscillator frequency to the reference frequency created by dividing the crystal 50a, 50b frequency to a lower value. The phase detector outputs 59a, 59b are filtered 61a, 61b to produce a phase error signal 60a, 60b which causes the LO 25, 43 frequency to deviate in such direction to minimize the error signal 60a, 60b. The LO 25, 43 locks onto the phase reference signal 60a, 60b and maintains a fixed phase relationship.

A negative consequence of using dual oscillators is the generation of harmonics of the fundamental oscillator frequencies. The harmonics of LO1 25 and LO2 43 mix with each other within active devices to create oscillator difference beats. To obviate the harmful effects of local oscillator harmonics from mixing together and entering the output IF of the settop terminal, the system 15 of the present invention eliminates this interference by translating the significant oscillator difference beats out of the 41 to 47 MHz output IF range.

Figure 2:
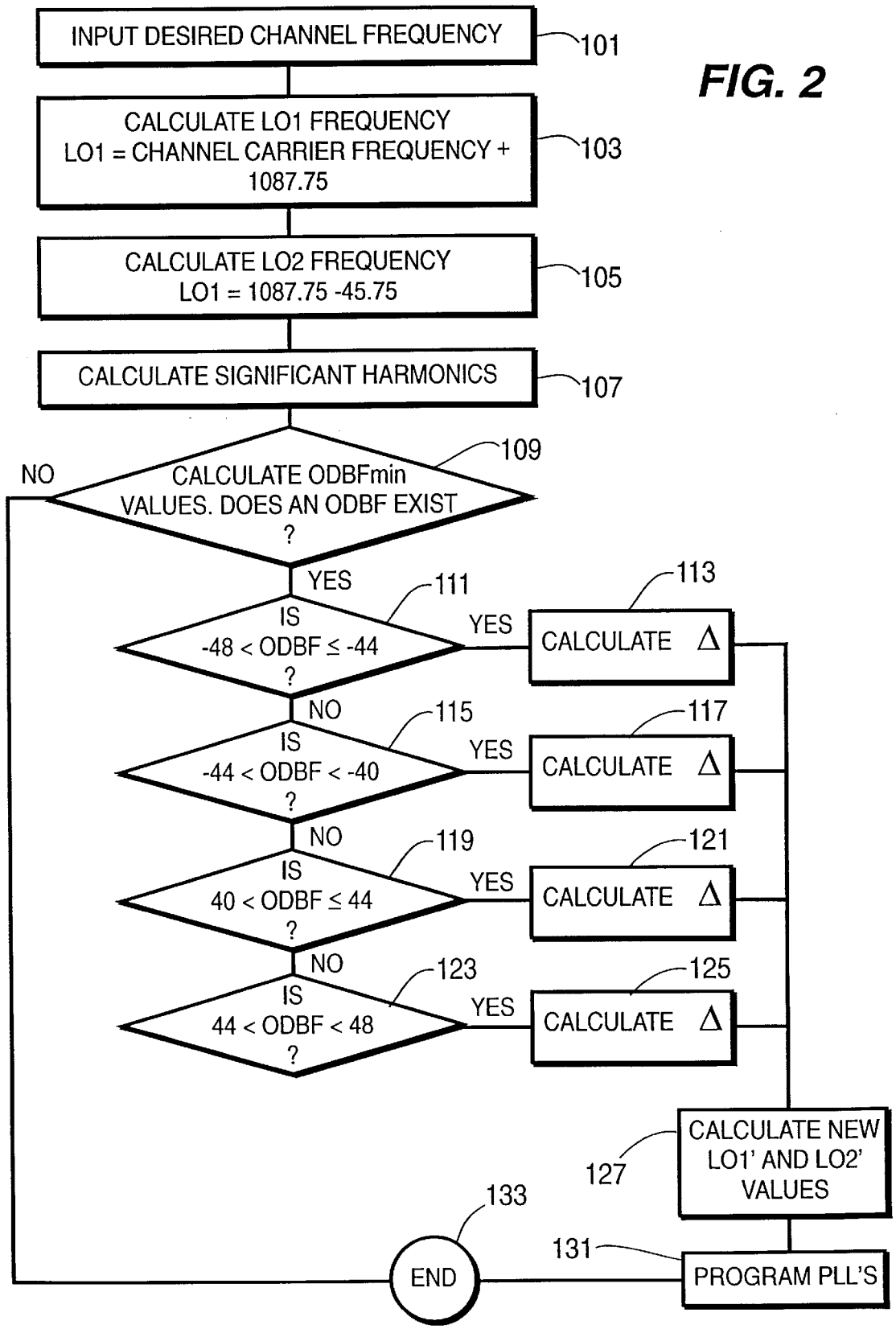
FIG. 2 is a flow chart of the oscillator frequency translation process.

With reference to the flow chart shown in FIG. 2, in operation, when a consumer chooses a desired channel (step 101), the selection is input into the system 15 via a touch pad 53, an IR emitter (not shown), or by a pay-per-view system. In accordance with a predetermined channel map, a corresponding memory word programmed in system memory 65 for the desired frequency is converted to two divide by numbers for the phase-locked loop dividers and output 55a, 55b to LO1 25 and LO2 43.

The elimination of oscillator difference beats is achieved by selectively adjusting the frequencies of LO1 25 and LO2 43 prior to tuning to the desired program selection. For a typical NTSC signal, the upconverter mixer 23 modulates the input RF picture carrier signal 29 with the output 27 of LO1 25 upconverting the signal to the HI-IF section 63 frequency 31 (1087.75 MHz) (step 103).

$$LO1 = \text{channel carrier frequency} + (HI\text{-}IF) \qquad \text{Equation (1)}$$

The downconverter mixer 41 modulates the HI-IF section 63 output 39 with the output 45 of LO2 43 downconverting to an output IF signal 47 frequency (45.75 MHz) (step 105).

$$LO2 = (HI\text{-}IP) - (IF) \qquad \text{Equation (2)}$$

Multiples of the LO1 25 and LO2 43 fundamental frequencies define the even and odd harmonics, $$m(LO1) \text{ and } m(LO2), \text{ for } m=2, 3, 4, \ldots \infty, \qquad \text{Equation (3)}$$

which represent all possible harmonics. However, due to the high system frequencies involved, examination of frequencies beyond the 10th harmonic is unnecessary (step 107).

The existence of an interfering oscillator difference beat frequency (ODBF) is determined by serially calculating the differences between two harmonics of LO1 25 and LO2 43 separated by at least one degree ($ODBF_{m,n}$) (step 109) until the absolute value of an $ODBF_{m,n}$ is within a given bandwidth or a predetermined number of $ODBF_{m,n}$ values are calculated. When an $ODBF_{m,n}$ absolute value is found within the given bandwidth, it is designated as the interfering oscillator difference beat frequency (ODBF). The general equation is $$OBDF_{m,n} = m(LO1) - (m+n)(LO2), \text{ for } m=2, 3, 4, \ldots 10 \qquad \text{Equation (4)}$$

with n=1 for a first series, n=2 for a second series, n=3 for a third series, and so on up to n=8 for all previously calculated harmonics (step 107). The $ODBF_{m,n}$ calculated from the differing degrees of LO1 25 and LO2 43 harmonics are then examined. If the ODBF lies outside of the 40 to 48 MHz band for NTSC signals, no adjustment of LO1 25 and LO2 43 is required. An ODBF exists and equals $ODBF_{m,n}$ if 40 MHz<$|ODBF_{m,n}|$<48 MHz.

For ODBF which fall inband, the following equations can be used to determine which direction LO1 25 and LO2 43 should be adjusted to translate the ODBF out of band:

−48 MHz < $ODBF$ ≤ −44 MHz     Equation (5A), (step 111)
adjust $LO$ frequency upwards −44 MHz < $ODBF$ < −40 MHz     Equation (5B), (step 115)
adjust $LO$ frequency downwards 40 MHz < $ODBF$ ≤ 44 MHz       Equation (5C), (step 119)
adjust $LO$ frequency upwards 44 MHz < $ODBF$ < 48 MHz       Equation (5D), (step 123)
adjust $LO$ frequency downwards To translate the oscillator difference beat below 40 MHz or above 48 MHz, the following equations are used to determine the $\Delta$ in frequency for the local oscillators:

$$\Delta = \frac{m(LO1) - (m+n)(LO2) + 48 \text{ MHz}}{(m+n) - m}$$ Equation (6A), (step 113)

$$\Delta = \frac{m(LO1) - (m+n)(LO2) + 40 \text{ MHz}}{(m+n) - m}$$ Equation (6B), (step 117)

$$\Delta = \frac{m(LO1) - (m+n)(LO2) - 40 \text{ MHz}}{(m+n) - m}$$ Equation (6C), (step 121)

$$\Delta = \frac{m(LO1) - (m+n)(LO2) - 48 \text{ MHz}}{(m+n) - m}$$ Equation (6D), (step 125)

The new L01' 25 and LO2' 43 frequencies are derived using:

$LO1'=LO1+\Delta$     A Equation (7A), (step 127)

$LO2'=LO2+\Delta$     A Equation (7B), (step 127)

The new local oscillator frequencies LO1' and LO2' translate the significant harmonic difference beats above or below the output IF signal 47 bandwidth of 41 to 47 MHz. The new local oscillator frequency values are used to program the phase-locked loops 51a, 51b, (step 131).

For example, if a consumer chooses channel 78, a standard CATV HRC channel which corresponds to an RF carrier frequency of 498 MHz, an output of 1586 MHz from LO1 25 would modulate and upconvert the carrier frequency to 1088 MHz.

$LO1=(498+1088)\text{MHz}=1586$ MHz    (from Equation 1)

To downconvert the HI-IF signal to the IF output frequency of 45.75 MHz for that carrier frequency, 1042.25 MHz is subtracted from the HI-IF carrier frequency of 1088 MHz.

$LO2=(1088-45.75)\text{MHz}=1042.25$ MHz    (from Equation 2)

To examine whether the oscillator difference beat frequencies lie within the 40 to 48 MHz IF passband region, the significant harmonic products are calculated.

2nd Harmonic of $LO1=2(LO1)=2(1586)=3172$ MHz (from Equation 3)

3rd Harmonic of $LO2=3(LO2)=3(1042.25)=3126.75$ MHz (from Equation 3)

The resulting difference between the 2nd harmonic of LO1 and the 3rd harmonic of LO2 is:

$ODBF_{2,1}=3172-3126.75=45.25$ MHz.    (from Equation 4)

The calculated ODBF falls within the 40 to 48 MHz range of the IF frequency band. Out of all possible combination of harmonics, the harmonics of interest are 2(LO1) and 3(LO2). All other $ODBF_{m,n}$ values lie outside of the IF frequency bandwidth. By using the system 15 and method of the present invention, the ODBF is translated above 48 MHz. This is accomplished by using Equations 5, 6, and 7 to determine the new LO1 25 and LO2 43 frequencies. To find the $\Delta$ frequency, if 44 MHz < $ODBF$ < 48 MHz,    (from Equation 5D)

$$\Delta = \frac{3126.75 - 3172 + 48 \text{ MHz}}{2 - 3}$$    (from Equation 6D)

$= -2.75$ MHz.

The new LO1' and LO2' frequencies are then:

$LO2'=LO2+\Delta$ 32 1042.25−2.75=1039.5 MHz    (from Equation 7A)

and $LO1'=LO1+\Delta=1586-2.75=1583.25$ MHz.    (from Equation 7B)

The new ODBF is therefore:

$ODBF=2(1583.25)-3(1039.5)=48$ MHz.    (from Equation 4)

The ODBF has been translated out of the IF band and can be removed by the IF SAW filter. If LO1 25 has a minimum step size, $\Delta$ should be rounded-up to the next step frequency allowed by the phase-locked loop.

For phase alternation line (PAL) systems, the channel bandwidth is either 7 or 8 MHz wide. This requires any ODBF to be moved to either 38 MHz or 48 MHz for the present SAW filter technology. An example of a ODBF falling inband with a 7 MHz channel bandwidth follows. PAL B channel E-9 has a carrier frequency of 203.25 MHz. After calculating all possible harmonics, the harmonics that produce harmful mixing are:

$LO1=(203.25+1087.75)\text{MHz}=1,291$ MHz    (from Equation 1)

$LO2=(1087.75-45.75)\text{MHz}=1,042$ MHz    (from Equation 2)

4th Harmonic of $LO1=4(LO1)=4(1,291)=5,164$ MHz (from Equation 3)

5th Harmonic of $LO2=5(LO2)=5(1,042)=5,210$ MHz (from Equation 3)

The ODBF fall at:

$ODBF=5164-5210=46$ MHz(absolute value).    (from Equation 4)

To translate the interfering ODBF, the following equations are used:

$$44\text{ MHz} < ODBF < 48\text{ MHz}, \quad \text{(from Equation 5A)}$$

$$\Delta = \frac{5164 - 5210 + 48\text{ MHz}}{5 - 4} = 2\text{ MHz} \quad \text{(from Equation 6A)}$$

$$LO1' = 1291 + 2 = 1293\text{ MHz} \quad \text{(from Equation 7A)}$$

$$LO2' = 1042 + 2 = 1044\text{ MHz} \quad \text{(from Equation 7B)}$$

The new ODBF is therefore:

$$ODBF = 4(1293) - 5(1044) = 48\text{ MHz(absolute value)} \quad \text{(from Equation 4)}$$

The system and method of the present invention move a resultant ODBF to a frequency outside of the IF band regardless of the channel bandwidth or channel frequency standard, thereby ensuring a television signal that is free of ODBF interference.

Although the invention has been described in part by making detailed reference to certain specific embodiments, such details are intended to be instructive rather than restrictive. It will be appreciated by those skilled in the art that many variations may be made in the structure and mode of operation without departing from the spirit and scope of the invention as disclosed in the teachings herein.

I claim:

1. A CATV settop terminal which includes a receiver for receiving a plurality of CATV channel signals, the settop terminal comprising:

a CATV channel selector for selecting a CATV channel signal from said plurality of CATV channel signals;

a first frequency agile local oscillator for generating a first frequency for mixing with said selected CATV channel signal to generate a fixed high intermediate frequency signal;

a filter for filtering said fixed high intermediate frequency signal;

a second frequency agile local oscillator for generating a second frequency, at a predetermined value, for mixing with said filtered fixed high intermediate frequency signal to generate a fixed low intermediate frequency signal;

a controller, responsive to said CATV channel selector, said controller including:

means for determining said first frequency based on said selected CATV channel signal;

means for comparing said first frequency with said second frequency to determine interfering oscillator difference beat (ODB) frequencies and for calculating a delta value based upon said ODB frequencies; and means for adjusting both said first and second frequencies by said delta value.

2. The settop terminal according to claim 1 wherein said fixed high intermediate frequency signal includes an analog signal transmission.

3. The settop terminal according to claim 1 wherein said fixed high intermediate frequency signal includes a digital signal transmission.

4. The settop terminal according to claim 1 wherein said filter has a passband bandwidth located above all of said CATV channel signals.

5. The settop terminal according to claim 1 wherein said fixed high intermediate frequency signal (HI_IF) contains said selected CATV channel signal.

6. The settop terminal according to claim 5 wherein said means for determining said first frequency further comprises:

a system microprocessor with collateral memory, said collateral memory storing a channel map of said CATV channel signals to predetermined channel carrier frequencies;

means for receiving said selected CATV channel signal and inputting said signal to said microprocessor; and said microprocessor determines said first frequency (LO1) based on the relationship:

$$LO1 = \text{channel carrier frequency} + (HI\text{-}IF)$$

whereby each of said channel carrier frequencies corresponds via said channel map to said requested CATV channel signal.

7. The settop terminal according to claim 6 wherein said second frequency (LO2) is:

$$LO2 = (HI\text{-}IF) - (IF)$$

said microprocessor determines an interfering oscillator difference beat frequency (ODBF) based on the relationship:

$$ODBF = (ODBF_{m,n})$$

for the first determined $ODBF_{m,n}$ which interferes with said fixed low IF signal where:

$$(ODBF_{m,n}) = m(LO1) - (m+n)(LO2) \text{ for every integer } m=2 \text{ through } x; n=1 \text{ through } y,$$

where x and y are selected integers greater than 2; and said $ODBF_{m,n}$ frequency is determined to interfere with said fixed low IF signal if the absolute value of the $ODBF_{m,n}$ frequency is within a predetermined bandwidth of said fixed low IF.

8. The settop terminal according to claim 7 wherein:

said predetermined low IF bandwidth has a lower end (L end), an upper end (U end) and a center (Ctr);

said initial local oscillator frequencies are adjusted by an adjustment value $\Delta$ where an interfering ODBF has been determined to adjust first and second local oscillator frequencies (LO1' and LO2') based upon the relationship:

$$LO1' = LO1 + \Delta$$

and $$LO2' = LO2 + \Delta;$$

where $\Delta$ is determined for the relationships:
   if:

$$-(U\text{ end}) < ODBF \leq -(Ctr),$$

then:

$$\Delta = \frac{m(LO1) - (m+n)(LO2) + (U\text{ end})}{(m+n) - m};$$

if:

$(L\ end) < ODBF \leq (Ctr)$ then:

$$\Delta = \frac{m(LO1) - (m+n)(LO2) - (L\ end)}{(m+n) - m};$$

if:

$-(Ctr) < ODBF < -(L\ end)$ then:

$$\Delta = \frac{m(LO1) - (m+n)(LO2) + (L\ end)}{(m+n) - m};$$

and if:

$(Ctr) < ODBF < (U\ end)$, then:

$$\Delta = \frac{m(LO1) - (m+n)(LO2) - (U\ end)}{(m+n) - m}.$$

* * * * *

UNITED STATES PATENT AND TRADEMARK OFFICE
CERTIFICATE OF CORRECTION

PATENT NO. : 6,057,876  
DATED : May 2, 2000  
INVENTOR(S) : Matthew Waight

Page 1 of 1

It is certified that error appears in the above-identified patent and that said Letters Patent is hereby corrected as shown below:

Column 3,
Line 23, after "LO1", before "minus" insert -- 25 --.

Signed and Sealed this

Twenty-eighth Day of August, 2001

Attest:

NICHOLAS P. GODICI
*Attesting Officer*  *Acting Director of the United States Patent and Trademark Office*